Figure 1:
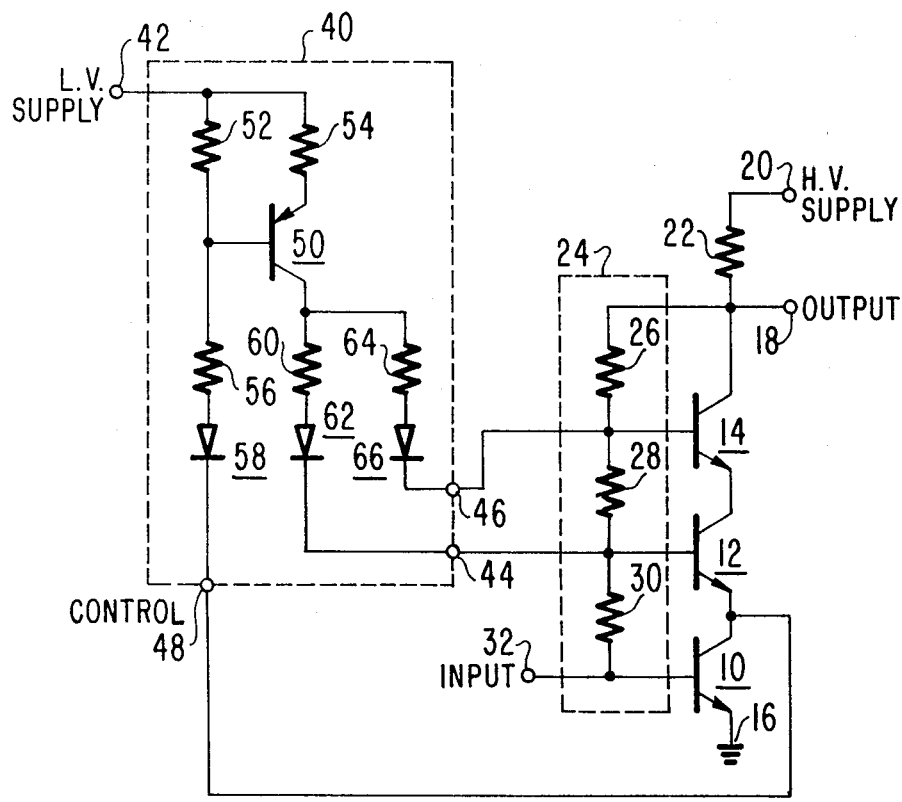

United States Patent [19]
Wittlinger

[11] 3,986,132
[45] Oct. 12, 1976

[54] SERIES ENERGIZED TRANSISTOR AMPLIFIER

[75] Inventor: Harold Allen Wittlinger, Pennington, N.J.

[73] Assignee: RCA Corporation, New York, N.Y.

[22] Filed: Oct. 22, 1975

[21] Appl. No.: 624,897

[52] U.S. Cl. .................... 330/18; 330/22; 330/40
[51] Int. Cl.² .......................................... H03F 3/42
[58] Field of Search .......................... 330/18, 22, 40

[56] References Cited
UNITED STATES PATENTS 3,546,614  12/1970  Lochstampfer ................. 330/40 X
3,622,899  11/1971  Eisenberg ......................... 330/18 X Primary Examiner—Robert Segal
Assistant Examiner—Lawrence J. Dahl
Attorney, Agent, or Firm—H. Christoffersen; S. Cohen; R. G. Coalter

[57] ABSTRACT

A plurality of transistors are connected in series together with a load across a source of operating potential. A primary bias circuit coupled to the transistors apportions the voltage across each transistor under quiescent conditions. A supplementary bias circuit, activated when the potential across one of the transistors is within a given range, supplies additional bias to other of the transistors of the series circuit.

4 Claims, 5 Drawing Figures

SERIES ENERGIZED TRANSISTOR AMPLIFIER

This invention relates to series energized transistor amplifiers.

A series energized transistor amplifier is an amplifier employing a load and a plurality of transistors connected in series across a source of operating potential and which includes a bias network for assuring a normally substantially equal distribution of voltage across each transistor. Such amplifiers permit output signal voltages in excess of the breakdown voltage ratings of the individual transistors and are capable of wider frequency response than that obtainable using a single transistor of equivalent voltage rating. This latter advantage results because commercially available low voltage rated transistors are typically superior to high voltage rated transistors in this respect.

Prior art series-energized transistor amplifiers suffer certain disadvantages. For example, to achieve maximum output signal dynamic range from a series amplifier employing bipolar (current controlled) transistors, it is customary to employ a low impedance bias network to insure that adequate base current can be supplied to all transistors of the series at the signal extremes and such a network unfortunately is wasteful of power. This wastefulness is particularly bothersome in relatively high voltage circuit applications such as oscilloscope power supply regulators or deflection amplifiers. A problem with dynamic range also exists in series amplifiers employing field effect (voltage controlled) transistors. As will be explained subsequently, the minimum output signal obtainable from such amplifiers is limited by the relatively large threshold voltages of the devices which accumulate to restrict dynamic range.

The present invention is directed to a series energized transistor amplifier wherein the transistors are quiescently biased so as to apportion the potential drop across them but which includes a supplementary bias circuit which is activated when the potential across one of the transistors is within a given range for supplying supplementary bias to other transistors of the series.

The invention is illustrated in the accompanying drawings wherein like reference numerals designate like elements and in which:

FIG. 1 is a circuit diagram of a series energized transistor amplifier embodying the invention; and FIGS. 2, 3, 4 and 5 illustrate modifications of the circuit of FIG. 1.

In FIG. 1 the collector-to-emitter paths of NPN transistors 10, 12 and 14 are connected in series, with the emitter of the first transistor 10 of the series connected to a reference potential point 16, illustrated as ground, and the collector of the last transistor 14 of the series connected to output terminal 18. The collector of transistor 14 is also coupled to high voltage (H.V.) supply terminal 20 by load 22. Bias for the series connected transistors is provided by primary bias circuit 24 (outlined in phantom) which comprises resistor 26 connected between the collector and emitter electrodes of transistor 14, resistor 28 connected between the base electrodes of transistors 14 and 12 and resistor 30 connected between the base electrodes of transistors 12 and 10. (Alternatively, resistor 30 may be connected between the base of transistor 12 and ground). The base electrode of transistor 10 is also coupled to an input terminal 32.

Supplementary bias circuit 40 (outlined in phantom) includes a low voltage (L.V.) supply terminal 42, two bias output terminals 44 and 46 connected, respectively, to the base electrodes of transistors 12 and 14 and a control terminal 48 connected to the collector of transistor 10. L.V. supply terminal 42 is connected to the base and emitter electrodes of PNP transistor 50 by resistors 52 and 54, respectively. The base electrode of transistor 50 is also connected to control terminal 48 by series connected resistor 56 and isolation diode 58, the latter being connected at its cathode to terminal 48. The collector of transistor 50 is connected to bias output terminal 44 by series connected current equalizing resistor 60 and isolation diode 62, the latter connected at its cathode to terminal 44. It is also connected to bias output terminal 46 by series connected current equalizing resistor 64 and isolation diode 66, diode 66 being connected at its cathode to terminal 44.

In operation, a relatively high (positive) potential is applied to H. V. supply terminal 20. This potential may be in excess of the collector-to-emitter breakdown voltage rating of any of the series connected transistors and, in fact, it could even exceed the sum thereof. The output voltage at terminal 18, however, cannot exceed the sum of the transistor breakdown voltages. Accordingly, in applications where maximum output signal dynamic range is required, transistor 10, 12 and 14 should be selected such that the sum of their breakdown voltage ratings is greater than the potential of H.V. supply terminal 20.

Primary bias circuit 24 apportions the voltage under quiescent conditions across the transistors in accordance with their respective breakdown voltage ratings. In the usual case, where the series transistors are all of the same or similar type, resistors 26, 28 and 30 are selected to bias the bases of transistors 12 and 14 such that each of the series transistor shares an equal portion of the output voltage at terminal 18 under quiescent conditions.

The selection of the primary bias circuit resistors in prior art series amplifiers is complicated by conflicting design requirements. The bias circuit must be of a relatively low impedance to guarantee an adequate supply of base drive current to the series transistors over the full range of desired output signal variations but must be of a high impedance to minimize output signal loading and unwanted power dissipation. There is no fully satisfactory solution to this dilemma.

The circuit of FIG. 1 provides an improved solution to this problem, at the cost of an additional circuit — the supplementary bias circuit 40. This circuit, which is activated when the potential across one of the transistors is within a given range, supplies additional bias to each of the other transistors of the series which has a selected electrode thereof at a potential within the given range. Because of this supplementary bias, the primary bias circuit may be of relatively high impedance without a sacrifice in the minimum obtainable output signal. The advantage of this is that primary bias circuit power dissipation is reduced and the output signal dynamic range at both signal extremes is increased. This may be appreciated by the following specific example of overall circuit operation.

Assume, for purposes of explanation, that a positive potential less than one sixth of that of terminal 20 is applied to L.V. supply terminal 42. Assume also that an input signal is applied to input terminal 32 such that the series transistors conduct a quiescent current through load 22 that maintains output terminal 18 at one-half of the H.V. supply potential. Assume further that resistors 26, 28 and 30 are selected to maintain the base terminals of transistors 12 and 14 at one-third and two-thirds of the output voltage, respectively, at least under this quiescent condition.

Under these assumptions the collector voltage of transistor 10 will be approximately equal to one sixth of the H.V. supply voltage. Since terminal 42 is at a lesser potential, isolation diodes 58, 62 and 66 are all reverse biased. Accordingly, in the quiescent condition, supplementary bias circuit 40 is disabled and all bias current for transistors 10, 12 and 14 is provided by the primary bias circuit.

Assume now that the input signal changes in a sense to decrease the current conducted by transistor 10. Since this current flows through load 22 the voltage drop thereacross will decrease so that the output voltage at terminal 18 will increase. This increasing voltage, applied via the voltage divider action of the primary bias circuit will increase the base voltages of transistors 12 and 14 proportionately. Accordingly, each transistor will continue to share an equal amount (one-third) of the output voltage. Since, in this case, the voltages at terminals 44, 46 and 48 are increasing the supplementary bias circuit 40 remains disabled. In the limit, when transistor 10 is completely cut-off, the output voltage at terminal 18 is determined by the voltage divider action of load 22 and bias circuit 24. Therefore, where the sum of the values of resistors 26, 28 and 30 is large relative to the impedance of load 22, the maximum value of the output voltage can be nearly equal to the potential of H.V. supply terminal 20.

Assume now that the input signal at terminal 32 varies in the opposite sense from its quiescent value so that transistor 10 conducts an increasing current thereby causing an increasing voltage drop across load 22. As that happens the output voltage, and thus the current flow through the primary bias circuit resistors, decreases. Since the base current for transistors 12 and 14 is obtained from the primary bias circuit and the current therethrough is decreasing, a point will be reached where the diverted base current is an appreciable portion of the total primary bias current. Eventually, (but for the action of supplementary bias circuit 40) base current starvation would occur for transistors 12 and 14. That is, the output voltage would reach a value such that resistors 26 and 28 could no longer supply adequate base current to those transistors. If such "starvation" were to occur, the resultant relatively large voltages across transistors 12 and 14 would necessarily limit the minimum attainable output voltage and thus limit the output signal dynamic range. What's more, the power dissipation of those transistors would be much higher than would be the case if they could be saturated rather than in a "current starved" condition. Before such starvation happens, however, supplementary bias circuit 40 is activated and supplies the needed additional base current as follows.

When the collector voltage of transistor 10 decreases to a value below the potential of terminal 42 sufficient to forward bias isolation idode 58, a current will begin to flow through resistors 56 and 52, which thereafter increases as the collector voltage of transistor 10 further decreases. The increasing voltage across resistor 52 applied to the base of transistor 50 primes that transistor to produce an output current at its collector. The value of that current is determined by the value of resistor 54 and the voltage across resistor 52 (less the base-emitter voltage drop of transistor 50).

While transistor 50 is primed to produce the aforementioned current, no current in fact flows to output terminals 44 and 46 until isolation diodes 62 and 66, respectively, are forward biased. That happens sequentially as the output voltage decreases since the base of transistor 12 is at a lower potential point in primary bias circuit 24 than the base of transistor 14. Specifically, when the voltage at the base of transistor 12 is sufficiently low to forward bias diode 62, transistor 50 supplies additional base current to transistor 12 via current equalization resistor 60 and diode 62. Since the current produced by transistor 50 is inversely related to the collector voltage of transistor 10 the additional base current increases as the output voltage decreases. Similarly, additional base current is provided to transistor 14 when the potential at the base thereof is sufficiently low to forward bias diode 66. In this manner supplementary bias current 40 provides sufficient base current to saturate the "stacked" transistors 12 and 14 thereby assuring that a minimum output signal very nearly equal to ground potential can be produced notwithstanding the use of a high impedance primary bias circuit.

Figure 2:
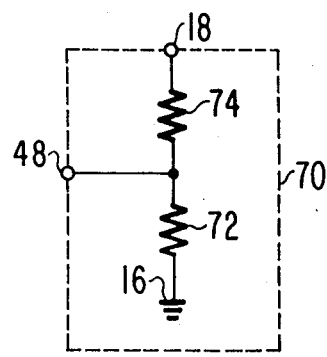

It is to be noted that control terminal 48 is connected to the collector of transistor 10 in FIG. 1. This connection provides the regenerative feedback signal that controls supplementary bias circuit 40. Alternatively, this connection may be made to the output terminal 18 or to the collector of transistor 12 provided that suitable voltage translating or attenuating means are provided. FIG. 2 illustrates how this may be done. There, a voltage divider 70 comprised of resistors 72 and 74 is connected between terminal 18 and ground 16, with the tap connected back to control terminal 48. The values of resistors 72 and 74 are selected so that a desired fraction of the output voltage is applied to control terminal 48 thereby activating the supplementary bias circuit when the output voltage falls below that fraction.

Current "hogging", that is, the tendency of one of transistors 12 or 14 to receive a disproportionate share of the supplementary base current, is prevented in the amplifier of FIG. 1 by equalization resistors 60 and 64. Alternative measures counteracting this problem are illustrated in FIGS. 3 and 4.

Figure 3:
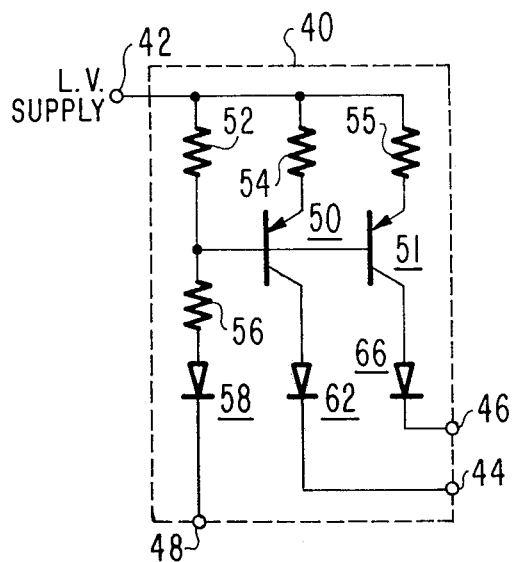
Figure 4:
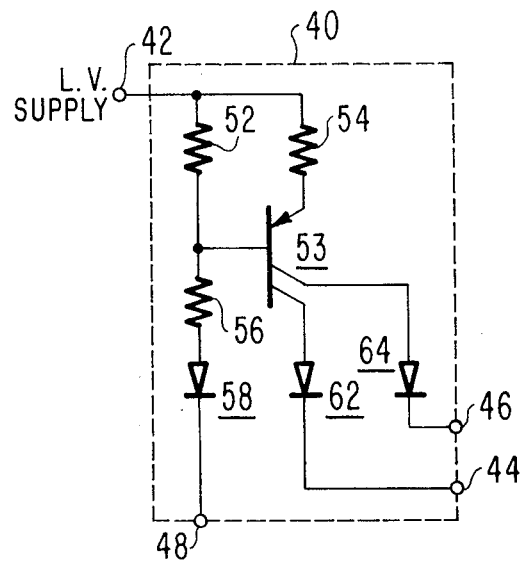

In FIG. 3, resistors 60 and 64 are eliminated. The anode of diode 62 is connected instead to the collector of transistor 50 and the anode of diode 66 is connected to the collector of a further transistor 51 which is connected at the base thereof to that of transistor 50 and at the emitter thereof via resistor 55 to L.V. supply terminal 42. The collector current of these transistors are independent of one another so that current hogging is avoided. Alternatively, as shown in FIG. 4, the current hogging problem may be eliminated by use of a "split collector" transistor 53. This use of a multicollector transistor has the advantage of requiring fewer circuit elements than the bias circuits of FIGS. 1 and 3.

Figure 5:
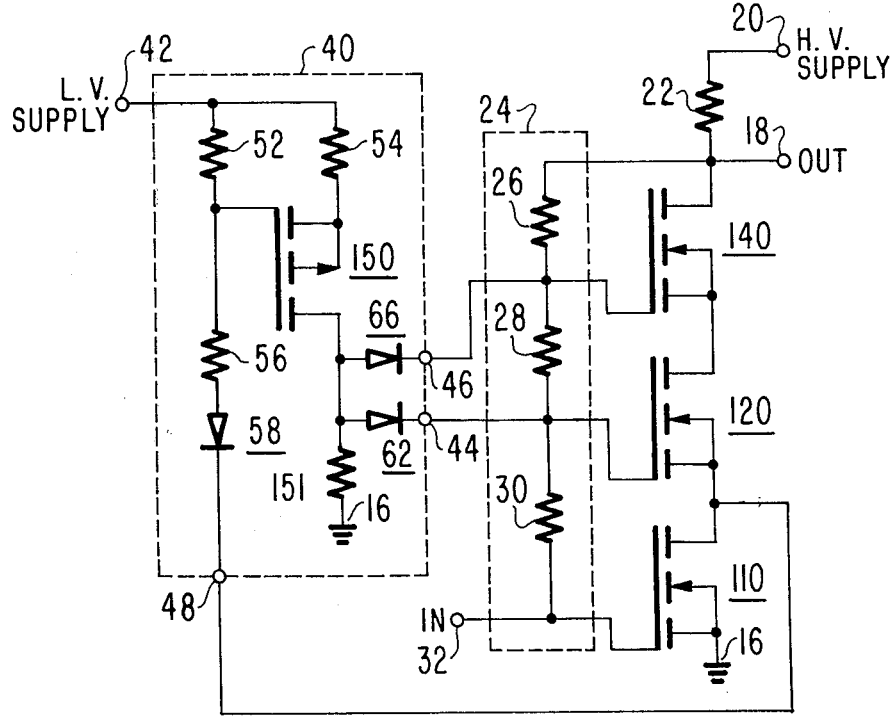

FIG. 5 illustrates a modification of the series energized amplifier of FIG. 1 in which NPN bipolar transistors 10, 12, 14 and 50 are replaced by enhancement mode field effect transistors 110, 120, 140 and 150, respectively, the first three transistors being of N-type and transistor 150 being of P-type. The source, gate and drain electrodes of the field effect transistors are connected here as the emitter, base and collector electrodes of the bipolar transistors in FIG. 1. Current equalization resistors 60 and 64, not needed here, are replaced by a drain load resistor 151 connected between the drain of transistor 150 and ground 16. The anodes of diodes 62 and 66 are connected to the drain of transistor 151.

Operation of the amplifier of FIG. 5 is much the same as that of FIG. 1. Primary bias circuit 24, for example, apportions the gate voltage of transistors 120 and 140 under quiescent conditions such that the stacked transistors share equal portions of the output voltage. Supplementary bias circuit 40 is primed to supply additional turn-on bias to transistors 120 and 140 when the drain voltage of transistor 110 is less than the potential at L.V. supply terminal 42. Each of the stacked transistors (120 and 140) receives this additional bias as its respective gate terminal falls to a potential sufficient to forward bias its respective isolation diode (62 or 66).

In more detail, an input signal applied to terminal 32 of a level sufficient to turn off transistor 110 will cause the output voltage to increase to a level determined by the potential at H.V. supply terminal 20 and the voltage divider action of load 22 and primary bias circuit 24. Conversely, an input signal level sufficient to turn on transistor 110 to the point where the drain voltage thereof is less than the potential of L.V. supply terminal 42 will cause a current to flow through resistor 52 which increases as the drain voltage further decreases. This increasing current develops a voltage across the gate and the source resistor of transistor 150, the drain of which supplies an increasing current through resistor 151 to ground 16. Simultaneously, the gate voltages of transistors 120 and 140 are decreasing due to the feedback thereto from the output terminal via primary bias circuit 24. Each of these transistors thus receives additional gate bias when its gate voltage falls to a value sufficient to forward bias the diode, 62 or 64, associated therewith. In this way gate-to-source voltages are applied to each of the transistors substantially in excess of its threshold voltage thereby insuring that output terminal 18 may assume a minimum voltage very near ground potential. In the limit, this minimum output voltage is determined principally by the potential of terminal 20, the impedance of load 22 and the sum of the "on-resistances" of the series transistors. That sum, in turn, is minimized by the additional gate bias provided by supplementary bias circuit 40.

In each of the embodiments of the invention it is to be noted that the feedback to the supplementary bias circuit is regenerative. This enhances the response time of the amplifier over the region in which the supplementary bias circuit is active. The amplifier is immune to "latch-up" notwithstanding this regenerative feedback, however, because in each case at least one transistor is directly controlled by the input signal. Accordingly, even though the closed loop gain can be in excess of unity under appropriate circumstances, it can always be reduced to less than unity under control of the input signal.

What is claimed is:
1. In combination:
   a first transistor and at least one further transistor, each having a conduction path and a control electrode, said conduction paths being connected in series between first and second terminals for conducting a load current therebetween;
   means for applying a control signal to the control electrode of said first transistor for controlling the flow of said load current;
   first bias means coupled to the control electrode of said further transistor for supplying a quiescent forward bias thereto;
   means for applying a reference potential to said first terminal;
   a third terminal for receiving a source of operating potential;
   a load connected between said second and third terminals;
   a current mirror amplifier having input, common and output terminals, said common terminal for connection to a source of potential intermediate said reference and operating potentials, said output terminal being coupled to said control electrode of said further transistor; and
   circuit means for applying an input current to said input terminal inversely proportional to a voltage across the conduction path of said first transistor.
2. The combination recited in claim 1:
   further including a plurality of said further transistors, the conduction paths of which are connected in said series with the conduction path of said first transistor; and wherein
   said first bias means comprises potential divider means coupled at one end thereof to said first terminal and at the other end thereof to said second terminal, said divider means having a plurality of taps at different voltage levels, each tap being coupled to the control electrode of a separate one of said further transistors; and
   said current mirror amplifier includes a plurality of said output terminals, each coupled to a separate one of said taps.
3. The combination recited in claim 1 wherein one end of the conduction path of said first transistor is connected to said first terminal and wherein said circuit means comprises a resistor connected between said input terminal of said current mirror amplifier and the other end of the conduction path of said first transistor.
4. The combination recited in claim 1 wherein said circuit means comprises:
   first and second resistors connected between said input terminal of said current mirror amplifier and, respectively, said first and second terminals.

* * * * *